United States Patent [19]

Sasada et al.

[11] Patent Number: 4,728,568

[45] Date of Patent: Mar. 1, 1988

[54] MASKING TAPE FOR USE IN MANUFACTURING A PRINTED BOARD

[75] Inventors: Shigeru Sasada, Kusatsu; Tetsuo Ohwada; Masaru Mishima, both of Tokyo, all of Japan

[73] Assignees: Dainippon Screen Mfg. Co., Ltd., Kyoto; Sanyo-Kokusaku Pulp Co., Ltd., Tokyo, both of Japan

[21] Appl. No.: 920,784

[22] Filed: Oct. 20, 1986

[30] Foreign Application Priority Data

Oct. 19, 1985 [JP] Japan ............... 60-234348

[51] Int. Cl.$^4$ ............ H01L 21/203; H01L 21/306; A61L 15/00
[52] U.S. Cl. .................. 428/349; 428/507; 428/511; 428/513; 428/514; 427/97; 427/154; 156/155
[58] Field of Search ............ 428/349, 507, 511, 513, 428/514; 427/97, 154; 156/155

[56] References Cited

U.S. PATENT DOCUMENTS

| | | | |
|---|---|---|---|
| 3,758,433 | 9/1973 | Muller | 524/375 |
| 3,948,701 | 4/1976 | Fasbender et al. | 156/155 X |
| 4,166,150 | 8/1979 | Mattor et al. | 428/513 X |
| 4,255,208 | 3/1981 | Deutscher et al. | 156/155 X |
| 4,448,622 | 5/1984 | Duchane et al. | 428/507 X |
| 4,503,098 | 3/1985 | Potts | 428/507 X |

FOREIGN PATENT DOCUMENTS 175645  3/1986  Japan .................. 428/511

OTHER PUBLICATIONS

Product Sample Packet from Mishima Paper Company, Ltd. of Japan.

*Primary Examiner*—George F. Lesmes
*Assistant Examiner*—D. R. Zirker
*Attorney, Agent, or Firm*—Lowe, Price, LeBlanc, Becker & Shur

[57] ABSTRACT

Disclosed is a masking tape suitable for use in manufacturing a printed circuit board. The masking tape comprises a water soluble paper as a tape base material, and a water soluble adhesive agent applied to one side of the paper. A method of filling through-holes employing such a water soluble masking tape in a process of manufacturing a printed circuit board is also disclosed.

10 Claims, 4 Drawing Figures

MASKING TAPE FOR USE IN MANUFACTURING A PRINTED BOARD

BACKGROUND OF THE INVENTION

1. Field of the Invention

The present invention relates to a masking tape for use in manufacturing a printed board having an electrically conductive layer formed on its surface and having formed, at specified points therein, through holes through which upper and lower circuitry patterns are to be electrically connected with each other, and more particularly to a masking tape for use in a process of filling up such through holes with a filler material, for example, an etching resist, and the like.

2. Description of the Prior Art

In order to obtain a printed board, an electrically insulating substrate such as phenolic resin, epoxy resin, or the like, coated with copper foil on its upper and lower side surfaces, is formed with holes that pass through the substrate at predetermined points thereof. The the substrate is then subjected to a photoetching treatment so as to effect a required connection between upper and lower circuitry patterns through the holes. Thus, the aimed printed board is obtained.

In the manufacturing process of forming such printed boards, a process of filling up the through holes formed therein with etching resist ink is one of factors that determine the final quality of products. Heretofore, the filling process has been conducted by, for example, methods illustrated in FIGS. 2 to 4.

According to the method of FIG. 2, masking tapes are applied to such portions as positioning holes for a pattern printing, end faces of a printed board, and the like which it would be troublesome to fill up with the ink. Then, one roller 4' of a pair of rollers 4, 4' for rotary drive is partially soaked in etching resist ink 3 stored in a tank 5, and thereafter a substrate 1 formed with through holes 2 is passed between the rollers 4, 4'. After completion of filling up the through holes 2 with the ink 3, that ink 3 which is sticking to the surface of the substrate 1 is wiped out by passing the substrate between a pair of squeezing blades 6, 6'. Then, the ink 3 thus having filled up the through holes 2 is surplus cured, and cured ink 3' is abraded off by means of an abrader, buff, brush, or the like and the substrate finally washed with water.

The method of FIG. 3, in which like parts are denoted by the same reference numerals, renders unnecessary such work as taping the positioning holes, the end faces of the substrate, and the like. According to this method, a substrate 1 coated with copper foil on its side surfaces and having through holes 2 formed at fixed points is mounted on a base 8 with a required space 7. A mask 10 formed with holes 9 is superposed on the substrate 1 such that the holes 9 coincide with the through holes 2, so that there is effected a covering over positioning holes 11 formed on peripheral edges of the substrate 1 for subsequent processes and on end faces 12. A squeezer 13 is passed over the mask 10, for application of pressure onto the surface of the mask 10 thus superposed, so that the through holes 2 are filled with ink 3 by way of the holes 9. Then, the mask 10 is taken off, and after curing the ink 3, excess cured ink is removed by abrading and washing as in the foregoing method.

Furthermore, according to the method of FIG. 4, in which like parts are also denoted by the same reference numerals, steps are taken for covering at least positioning holes 11 on the peripheral edges and end faces 12 of the substrate 1 with a mask plate 13; arranging a first squeezer 14 and a second squeezer 14' across the substrate 1; and filling up the through holes 2 with the ink 3 by squeezing the substrate 1 with the first squeezer 14 for application of pressure to the substrate 1 while constantly keeping the second squeezer 14' behind the first squeezer 14 in the proceeding direction so that the second squeezer 14' can support the substrate 1 and at the same time scape off excess ink passed from the through holes 2.

However, the following problems are encountered in conducting the process of filling up the through holes by the use of a commercially available adhesive tape according to the method illustrated in FIG. 2:

(1) While it is possible to mechanize the taping process, it is extremely difficult to mechanize the process of peeling off the tape that adheres to a substrate after curing of the ink filled within the through holes. Because the adhesive tape would be in a state of being welded due to exposure to high temperature during the process of ink curing, even manual peeling of such tape is hard to effect and mechanical peeling all the more so. Thus the difficulty in mechanization of the peeling process is an obstacle to automatization of the printed board manufacturing process that includes the process of filling up the through holes.

(2) When removing excessive ink cured and sticking to the surface of the substrate by abrading and washing after curing the ink filled within the through holes, and at the same time scraping off the adhesive tape applied, circumstances often occur in which the tape remains stuck if it is composed of strong tape material and has an adhesive agent of high adhesion. Meanwhile, if the tape is composed of a strong tape material and an adhesive agent of low adhesion, the surface of the substrate can be clean but pieces of the tape material taken off remain inside the abrader, buff, and the like. On the other hand, if the tape material is weak while the adhesive agent is of high adhesion, the adhesive agent remains stuck to the surface of the substrate, thereby preventing the surface from being clean. If both the tape material and the adhesive agent are weak, the surface of the substrate can be clean but pieces of the tape material taken off remains inside the abrader, buff, and the like, thus causing problems.

In the case of the method illustrated in FIG. 3, no problem arises due to taping as mentioned above, nor do problems such as entering of the ink 3 into the positioning hole 11 or sticking thereof to the end faces 12 of the substrate when the through holes 2 are filled up with the ink 3. However, when the ink 3 filled in the through holes 2 is cured as partially split on or spreading over the surface of the substrate, it is necessary to repeat the scraping process in order to remove the spreading ink 3 from the surface of the substrate 1. Apparently, such repetitious scraping renders the copper layer on the surface thinner. Accordingly, measures must be taken to avoid this problem. If the ink 3 spilled or spread out of the through holes 2 is cleaned with the squeezing blades 6, 6' (per FIG. 2) or the squeezers 14, 14' (per FIG. 4) prior to a hardening process to this end, the scraped ink may enter in the positioning holes 11 or stick to the end faces 12 of the substrate, eventually making the mask useless. Hence, it has been necessary to clean the positioning holes 11 manually, taking much time and labor, with the result that such a manufacturing process is not feasible.

When it comes to the method depicted in FIG. 4, although the problem does not exist that the ink 3 enters into the positioning holes 11, 11' or sticks to the end faces 12, 12' from the upper side of the substrate, it may easily happen that the ink 3" scraped off by the second squeezer 14' gets into the positioning hole 11' or sticks to the end face 12' from the lower side of the substrate 1, since the positioning hole 11' and the end face 12' located in the slidingly moving direction of the squeezer 14'. If the ink 3 acutally gets into the positioning hole 11', then the aforementioned problem arises. Further, if the ink 3" sticking to the end face 12' is hardened, the hardened ink may be partially removed during the printing process so as to give rise to scumming and pinholes, thus adversely affecting the printing accuracy that depends on abutting positioning. As a result, it becomes necessary to clean the same manually in the same manner as in the case of the positioning holes, likewise taking much time and labor.

SUMMARY OF THE INVENTION

In order to solve the abovementioned problems pertaining to the prior art, the present invention has an object to provide a novel masking tape for use in the process of filling up the through holes formed in the printed boards with the filler material.

Another object of the invention is to provide a novel and improved method for manufacturing a printed board.

To attain the above objects, according to an aspect of the invention, there is provided a masking tape for use in a process of filling up through holes in a printed board with a filler material, which comprises a water soluble paper as a tape base material and a water soluble adhesive agent applied to one side of the paper.

In a preferred embodiment, the water soluble adhesive agent is composed of one selected from the group consisting of an acrylic acid resin and a methacrylic acid resin as an adhesive constituent and a derivative of polyethylene glycol as a hydrophilic softening constituent blended with the selected adhesive constituent.

In another preferred embodiment, the adhesive constituent and hydrophilic softening constituent are blended with each other in the ratio of 100 parts to 50-150 parts.

In a further preferred embodiment, the acrylic acid resin is a copolymer composed of from about 70% to about 90% by weight of alkyl ester monomer of acrylic acid of carbon number 4 and about 10% to about 30% by weight of a monomer containing a carboxyl group, from about 50% to about 80% of the carboxyl group being neutralized.

In still another embodiment, the methacrylic acid resin is a copolymer composed of from about 70% to about 90% by weight of alkyl ester monomer of methacrylic acid of carbon number 4 and about 10% to about 30% by weight of a monomer containing a carboxyl group, from about 50% to about 80% of the carboxyl group being neutralized.

Preferably, the copolymer comprises not more than 10% of a vinyl monomer.

Still preferably, the derivative of polyethylene glycol is not more than 1,000 in molecular weight and expressed by the molecular formular of $R_1O.(CH_2CH_2O)n.R_2$, where $R_1$ is an alkyl group of which hydrogen or carbon number is 1-2, $R_2$ is one selected from the group consisting of an alkyl group and an acetyl group whose hydrogen or carbon number is 1-2, and n is an integer.

According to another aspect of the invention, there is provided a method of filling through-holes in a process of manufacturing a printed circuit board, comprising the steps of:

preparing a substrate for use in manufacturing a desired printed circuit board, electrically conductive layers being formed on both sides of said substrate, with through-holes provided for conducting electricity between the layers and positioning holes provided for positioning said substrate at a desired position;

covering the positioning holes and peripheral edges of said substrate with a water-soluble tape;

filling the through-holes with a stuffing material;

hardening the stuffing material; and removing undesirable stuffing material applied on the substrate, and simultaneously removing the water soluble tape by applying water thereto.

DETAILED DESCRIPTION OF THE PREFERRED EMBODIMENTS

Described hereunder is a preferred embodiment of the invention.

A printed board having an electrically conductive layer formed on its surface is formed with through holes at specified points after treating a material therefor with processes of cutting, punching, plating with copper, and the like. A process of filling up the through holes is then applied to the printed board. Positioning holes are formed at 2 to 4 points on the peripheral edge portions of the printed board for positioning it in a subsequent circuitry pattern printing process in advance of the filling process.

Figure 1:
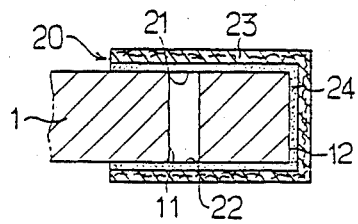
FIG. 1 is a sectional view illustrating an embodiment of the present invention.

In order to prevent these positioning holes from being subjected to entering of a filler material during the filling process and end faces of the board from being subjected to sticking thereof, these portions are covered with a masking tape according to the invention. FIG. 1 shows a substrate 1 in a state of being covered with such masking tape 20, which is adhered to peripheral portions of the substrate 1 for covering upper and lower openings 21, 22 of a positioning hole 11 and an end face 12 of the substrate. The masking tape 20 is composed of a tape material 23 and an adhesive agent 24 applied to one side of the tape base material 23, and both of the material 23 and agent 24 are water soluble. In this connection, the term "water soluble" herein includes the meaning of a property of "rapid dispersion into water".

A commercially available water soluble paper can satisfactorily serve as the tape base material of the masking tape according to the invention. As for the adhesive agent, any material can be used in so far as it has adhesion of a required level and at the same time is water soluble. Using, for example, a derivative of polyethylene glycol as hydrophilic softening component, the following composition can be employed as the water soluble adhesive agent:

EXAMPLE

Constituent (A) as a main polymer: a copolymer composed of from about 70% to about 90% by weight of alkyl ester monomer of acrylic acid (or methacrylic acid) of carbon number 4 as an adhesive constituent, about 10% to about 30% by weight of a monomer containing a carboxyl group as a water soluble constituent, and from about 0% to about 10% by weight of vinyl monomer other than the aforementioned one as a cohesive constituent, these constituents being copolymerized, and from about 50% to about 80% of the carboxyl group that makes up a product of copolymerization being thereafter neutralized.

The enhancement of the water soluble property is effected by the extremely large amount of the content of the monomer containing a carboxyl group that performs the function of the water soluble constituent in relation to the other contents. The neutralization of the carboxyl group that makes up the copolymer is intended to obtain easy water solubility of the copolymer. Potassium hydroxide, sodium hydroxide, aminopropanol, and the like are used as a neutralizer. The addition of the vinyl monomer as the cohesive constituent is intended to intensify the hardness of the adhesive agent, and therefore such addition is to be conducted when necessary.

Constituent (B) as the hydrophilic softener: a derivative of polyetylene glycol of molecular weight not more than 1,000 and expressed by the molecular formular of $R_1O.(CH_2CH_2O)n.R_2$, where $R_1$ denotes an alkyl group of which hydrogen or carbon number is 1-2, $R_2$ represents an alkyl group or acetyl group of which hydrogen or carbon number is 1-2, and n expresses an integer.

The above constituents (A) and (B) are blended with each other in the ratio of 100 parts to 50-150 parts to obtain the water soluble adhesive agent.

Described hereunder are examples of a method for manufacturing the masking tape according to the invention.

EXAMPLE 1

A copolymer composed of 25 parts by weight of acrylic acid and 75 parts by weight of butyl acrylic acid is dissolved in a mixed solvent of isopropanol/methanol=50/50 to obtain a 45% solution. Potassium hydroxide, of which the mole ratio to the carboxyl group of the copolymer is 80%, is added to the solution for mixture therewith. In the solution thus obtained, 50 parts by weight of polyethylene glycol monoetylether of a molecular weight of approximately 500 is blended with 100 parts by weight of the solid coplymer aforesaid, and diluted by a further addition of the mixed solvent of isopropanol/methanol=50/50 so that the solid constitutes 40% of the whole solution.

The solution prepared as above is applied to a mold releasing paper in an amount of 25 $g/m^2$ approx. (in solid), which is dried for three minutes at 100° C., then transferred to a commercially available water soluble paper to obtain a tack paper I.

EXAMPLE 2

A copolymer composed of 20 parts by weight of acrylic acid, 75 parts by weight of acrylic acid 2-etylhexyl and 5 parts by weight of vinyl acetate is dissolved in a mixed solvent of isopropanol/methanol=50/50 to obtain a 45% solution. Sodium hydroxide, of which mole ratio to the carboxyl group of the copolymer is 80%, is added to the solution for mixture therewith. In the solution thus obtained, 50 parts by weight of polyethylene glycol monomethyl acetate of a molecular weight of approximately 1,000 is blended with 100 parts by weight of the solid copolymer aforesaid, and diluted by a further addition of the mixed solvent of isopropanol/methanol=50/50 so that the solid occupies 40% of the whole solution. The solution thus prepared is applied to a mold releasing paper in the same manner as in Example 1 to obtain a tack paper II.

The tack paper I, II prepared as described above underwent tests on their water solubility, tackiness, peel strength and holding power, the results of which are shown in the following table I. In the water solubility test, a sample of tack paper is pasted up to on a glass plate at room temperature, and after soaking in water for 15 minutes, it is taken out of the water to see whether or not the tack paper is completely peeled off from the glass plate. As for the tackiness, peel strength and holding power, results are measured according to JIS Z-0237.

TABLE I

| | Water solubility | Tack | Peel strength | Holding power |
|---|---|---|---|---|
| Tack paper I | Removed complete | 5 | 700–800 | 60 |
| Tack paper II | Removed complete | 8 | 800–900 | 35 |

As is apparent from the above table, tack papers prepared by the manufacturing methods according to Examples 1 and 2 have the required adhesive strength and water solubility, satisfying requirements for the masking tape according to the invention.

Figure 2:
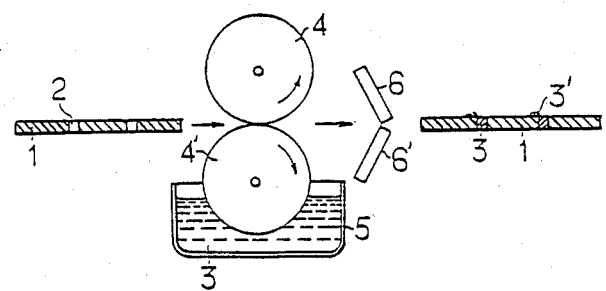
FIGS. 2 through 4 are sectional views showing known methods.
Figure 3:
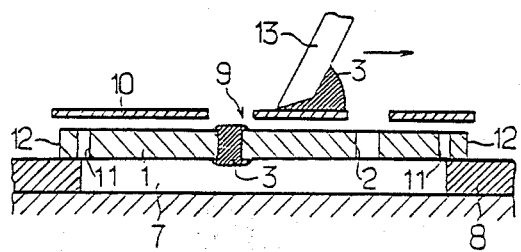
Figure 4:
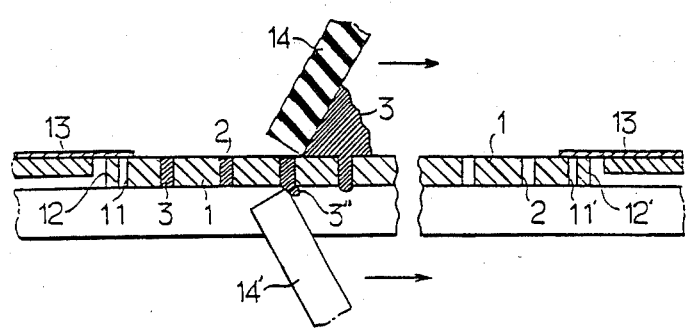

After completion of the application of the masking tape to peripheral edges of the substrate, the through holes are filled up with a filler material such as thermosetting ink, ultraviolet setting ink, and the like. This process of filling up the through hole is executed by means of a filling up machine as shown in FIG. 2, for example. Since the positioning holes and end faces of the substrate are covered with the masking tape, these parts are successfully prevented from being subjected to the entering or sticking of ink during the filling up process.

After completing the filling up the through holes with ink, the ink in the through holes is cured by a suitable method, for example, irradiating the surface of the substrate with infrared or ultraviolet rays depending on the type of ink being employed. After hardening of the ink, excessive ink that is sticking to and cured on the surface of the substrate in the filling up process is scraped off, and the same time the surface of the substrate is abraded and washed in order to peel the masking tape therefrom. An abrader, buff, or the like is used for the abrading. Since such abrading is performed while holding the substrate in water or bathing the surface thereof in water, the mask tape, which is water soluble, is quite easily peeled from the substrate surface and solved in the water or rapidly dispersed therein.

A printed board of which a surface has been cleaned by such abrading and washing process is thereafter formed into a finished printed circuit board by undergoing the process of circuitry pattern printing, etching, terminal plating, solder resist printing, soldering levelling, cutting, and the like.

It should be understood that the foregoing relates to only a preferred embodiment of the invention, and that it is intended to cover all changes and modifications of the example of the invention herein chosen for the purposes of the disclosure, which do not constitute departures from the spirit and scope of the invention.

What is claimed is:

1. A masking tape for use in a process of filling through-holes in a printed board with a filler material, comprising:
    a water soluble paper as a tape base material; and
    a water soluble adhesive agent applied to one side of said paper.

2. A masking tape as claimed in claim 1, wherein said water soluble adhesive agent is composed of a resin selected from a group consisting of an acrylic acid resin and a methacrylic acid resin as an adhesive constituent, blended with a derivative of polyethylene glycol that serves as a hydrophilic softening constituent.

3. A masking tape as claimed in claim 2, wherein said adhesive constituent and said hydrophilic softening constituent are blended with each other in the ratio of 100 parts to 50–150 parts.

4. A masking tape as claimed in claim 2, wherein said acrylic acid resin is a copolymer composed of from about 70% to about 90% by weight of alkyl ester monomer of acrylic acid of carbon number 4 and about 10% to about 30% by weight of a monomer containing a carboxyl group, from about 50% to about 80% of said carboxyl group being neutralized.

5. A masking tape as claimed in claim 2, wherein said methacrylic acid resin is a copolymer composed of from about 70% to about 90% by weight of alkyl ester monomer of methacrylic acid of carbon number 4 and about 10% to about 30% by weight of a monomer containing a carboxyl group, from about 50% to about 80% of said carboxyl group being neutralized.

6. A masking tape as claimed in claim 4, wherein said copolymer comprises not more than 10% of a vinyl monomer.

7. A masking tape as claimed in claim 2, wherein said derivative of polyethylene glycol is not more than 1,000 in molecular weight and expressed by the molecular formular of $R_1-O-(CH_2CH_2O)n-R_2$ where
    $R_1$ is H or an alkyl group containing 1 to 2 carbon atoms,
    $R_2$ is hydrogen or an alkyl or acetyl group containing 1 to 2 carbon atoms, and
    n is an integer.

8. A method for filling through-holes in a process of manufacturing a printed circuit board, comprising the steps of:
    preparing a substrate for use in manufacturing a desired printed circuit board for forming electrically conductive layers on both sides of said substrate and then forming through said conductive layers and substrate both through-holes for conducting electricity between the layers and positioning-holes for positioning said substrate at a desired position;
    covering said positioning-holes and peripheral edges of said substrate with a water soluble tape comprising a water soluble paper coated with a water soluble adhesive agent;
    filling said through-holes with a filling material capable of hardening in place;
    hardening said filling material; and
    removing any excess and undesirably located filling material applied on said substrate, and simultaneously removing said water soluble tape by applying water thereto.

9. A method according to claim 8, wherein said step of removal of any excess and undesirably located material comprises abrading thereof.

10. A method according to claim 9, wherein said abrading is carried out under water so that both the water soluble tape and said abraded filling material mix with said water upon removal from said substrate.

* * * * *